(12) United States Patent
D'Souza et al.

(10) Patent No.: US 8,589,461 B1
(45) Date of Patent: Nov. 19, 2013

(54) DYNAMICALLY RE-CONFIGURABLE SIGNAL DECIMATION SYSTEM USING A FINITE IMPULSE RESPONSE (FIR) FILTER

(75) Inventors: Maria D'Souza, San Jose, CA (US); Tony San, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 915 days.

(21) Appl. No.: 10/396,194

(22) Filed: Mar. 24, 2003

(51) Int. Cl.
G06F 17/17 (2006.01)
(52) U.S. Cl.
USPC .......................................... 708/313; 708/300
(58) Field of Classification Search
USPC ................................................. 708/300–323
See application file for complete search history.

(56) References Cited

U.S. PATENT DOCUMENTS

| | | | | | |
|---|---|---|---|---|---|
| 5,157,395 | A | * | 10/1992 | Del Signore et al. | 708/313 |
| 5,329,553 | A | * | 7/1994 | Abbiate et al. | 375/247 |
| 5,515,402 | A | * | 5/1996 | Chester | 708/313 |
| 5,768,311 | A | * | 6/1998 | Betts et al. | 708/313 |
| 5,872,480 | A | * | 2/1999 | Huang | 708/313 |
| 5,880,980 | A | * | 3/1999 | Rothacher et al. | 708/313 |
| 5,926,455 | A | * | 7/1999 | Allpress | 708/320 |
| 6,041,339 | A | * | 3/2000 | Yu et al. | 708/313 |
| 6,141,671 | A | * | 10/2000 | Adams et al. | 708/313 |
| 6,532,273 | B1 | * | 3/2003 | Mobin et al. | 708/313 |
| 6,546,407 | B2 | * | 4/2003 | Jiang et al. | 708/313 |
| 6,774,822 | B1 | * | 8/2004 | Thomson | 341/61 |
| 6,834,292 | B2 | * | 12/2004 | Jiang et al. | 708/313 |
| 6,956,512 | B1 | * | 10/2005 | San et al. | 341/120 |
| 7,126,504 | B2 | * | 10/2006 | Thomson | 341/61 |
| 2002/0198913 | A1 | * | 12/2002 | Johnson | 708/313 |
| 2008/0046492 | A1 | * | 2/2008 | Sundstrom | 708/200 |

* cited by examiner

*Primary Examiner* — Michael D Yaary
(74) *Attorney, Agent, or Firm* — Weaver Austin Villeneuve & Sampson LLP

(57) ABSTRACT

A signal decimating system decimates an initial data signal having an initial data rate R to a final data signal having a final data rate R" in two stages, using a base decimation factor N and a decimation multiplier factor P. In the first stage, N FIR filters having coefficients corresponding to the final data rate R" condition the initial data signal using the final data rate coefficients and thereafter decimate the initial data signal, as conditioned, by a base decimation factor of N to generate an intermediate data signal having an intermediate data rate R', where $$R' = \frac{R}{N}.$$

In the second stage, a sub-sampling unit includes a switch that sub-samples the intermediate data signal at a sub-sampling rate P to generate a final data signal having a final data rate R", where $$R'' = \frac{R'}{P} = \frac{R}{(N \times P)}.$$

38 Claims, 11 Drawing Sheets

DYNAMICALLY RE-CONFIGURABLE SIGNAL DECIMATION SYSTEM USING A FINITE IMPULSE RESPONSE (FIR) FILTER

BACKGROUND OF THE INVENTION

1. Field of the Invention

This invention relates generally to digital signal processing and specifically to the implementation of a dynamically re-configurable decimation system in various digital devices, including programmable logic devices.

2. Description of Related Art

Many digital signal processing devices use decimation to condition input data for various reasons. Decimation, or downsampling, of a signal reduces the number of data points in the original data signal, typically to permit use of the data at a lower data rate. Decimation is used in a variety of digital signal processing devices in a wide range of applications (for example, medical imaging).

In its simplest implementation, data rate decimation can be performed by merely removing original data points to achieve a desired reduced data rate. For example, in FIG. 1, an original signal 51 having data points 50 in FIG. 1a can be decimated by a factor of 2 by merely "deleting" every other data point 50, yielding the decimated signal 52 in FIG. 1b. While this technique might be sufficiently accurate in some applications requiring less precision, the decimated signal typically loses important information contained in the deleted data points. This is especially true where larger decimation factors are used, as seen in the example of FIG. 1c, where the original signal 51 of FIG. 1a has been decimated by a factor of 5 by keeping only every fifth data point to yield signal 55. A comparison of signal 51 and signal 55 shows that intermediate, deleted data points should have an effect on or be taken into consideration in producing the decimated signal 55. However, the simple deletion of data points fails to do this.

One technique for more accurately portraying an original signal after decimation is the use of polyphase decomposition. Polyphase decomposition uses basic finite impulse response (FIR) filtering to remove noise and take into account contextual data information contained in an original signal that is being decimated. A more desirable signal decimation than mere deletion of data points and/or values is achievable using a standard decimation technique, as shown in FIG. 2a. To decimate a signal, a low-pass filter is applied at 61, which removes spectral components that are not present at the targeted lower sample rate. After filtering, appropriate data points of the conditioned signal can be deleted at 62. This process is seen as applied to the data points 70 of an original signal 71 in FIG. 2b. After appropriate filtering in FIG. 2c, the data has been conditioned for decimation of the signal in FIG. 2d.

The decimation shown in FIG. 2 can be performed by typical polyphase decomposition. Such decimation techniques are explained in detail in Altera Application Note 73 (ver. 1.01, February 1998) and the Altera FIR Compiler Megafunction User Guide (ver. 2.6, October 2002), which both are incorporated herein by reference in their entireties for all purposes. In such a decimation system, a commutator cyclically delivers data to the input of each polyphase filter in the decimation system. The filters store or have access to coefficients that are calculated to condition the incoming signal's data to achieve the desired output signal characteristics for a fixed, reduced data rate (for example, removing the undesirable frequency components of the signal prior to decimation). These coefficients are multiplied by the appropriate data value and the outputs of the filters are the data/coefficient products, which are fed to an adder. The final data values are the sums of the data/coefficient products. Polyphase decimation filters provide speed optimization because each filter runs at the output data rate.

A programmable logic device ("PLD") is a programmable integrated circuit that allows the user of the circuit, using software control, to program the PLD to perform particular logic functions. A wide variety of these devices are manufactured by Altera Corporation of San Jose, Calif. The basic structure and operation of PLDs are well known to those of ordinary skill in the art. Logic functions performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform a particular function or functions required by the user's application. The PLD then can function in a larger system designed by the user just as though dedicated logic chips were employed.

Many applications require multiple decimation rates due, for example, to changing conditions within a digital signal processing environment. In cases where different decimation rates are required and/or desirable, hardware-based structures have been used to implement all of the desired decimation rates. Such structures are frequently undesirable due to their large size (using substantial resources in the digital signal processing device) and slow operation. These digital signal processing devices typically implement separate decimation systems for each decimation rate needed by the user.

FIR filters have been implemented in PLDs as part of digital signal processing systems to perform signal preconditioning, anti-aliasing, band selection, decimation/interpolation, low-pass filtering and video convolution functions. PLDs are flexible, high-performance devices that can easily implement FIR filters. For example, a PLO can be used for one or more critical filtering functions in a digital signal processing (DSP) microprocessor-based application, freeing the DSP processor to perform the lower-bit-rate, algorithmically complex operations. A DSP microprocessor can implement an 8-tap FIR filter at 5 million samples per second (MSPS), while an off-the-shelf FIR filter circuit can deliver 30 MSPS. In contrast, PLDs such as those manufactured by Altera. Corp. can implement the same filter at over 100 MSPS. The coefficients of a FIR filter can be calculated and/or generated in various ways. For example, one can use the FIR compiler that is the subject of U.S. application Ser. No. 09/773,853, filed Jan. 31, 2001, and assigned to Altera Corp., which is incorporated herein by reference in its entirety for all purposes. Coefficients also can be created using other applications such as MATLAB. The calculation and generation of coefficients by different types of coefficient generators is known to those skilled in the art.

A conventional FIR filter is a weighted tapped delay line. The filter design process involves identifying coefficients that will yield the frequency response specified for the particular system for which the FIR filter is being designed. The signal frequencies that pass through the filter can be modified simply by changing the values of the coefficients or by adding more coefficients.

Digital signal processors with a limited number of multiplier-accumulators require many clock cycles to compute each output value because the number of cycles is directly related to the order of the filter. A dedicated hardware solution can achieve one output per clock cycle. In contrast, a fully parallel, pipelined FIR filter implemented in a PLD can be operated at data rates above 100 MSPS, making PLDs ideal for high-speed filtering applications.

Systems, methods and techniques that permit a range of decimation rates and factors (that is, data rate reductions), while efficiently using area, speed and other resources in a PLD or other digital signal processing device would represent a significant advancement in the art. Moreover, generating a flexible structure, using a single, fixed hardware structure, to implement a variety of decimating FIR filters whose rates can be dynamically changed at run time would likewise constitute a significant advancement in the art.

BRIEF SUMMARY OF THE INVENTION

The present invention is a dynamically re-configurable decimation system that permits a fixed hardware structure to implement a variety of decimating filters whose rates can be dynamically changed at run time. The present invention also uses area and speed efficiently.

More specifically, the signal decimating system of the present invention performs decimation in two stages, decimating an initial data signal by a base decimation factor N for the first stage and sub-sampling the resulting intermediate data signal by a decimation multiplier factor P for the second stage. Using this system, an initial data signal having an initial data rate R is decimated to a final data signal having a final data rate R". In the first stage, the initial data signal is conditioned using N FIR filters having coefficients corresponding to the final data rate R". The N FIR filters are single rate filters that also decimate the initial data signal, as conditioned (also referred to as the conditioned data signal, by a base decimation factor of N, where $$R' = \frac{R}{N}.$$

N represents the smallest decimation factor by which the initial signal can be decimated. This also represents the granularity of the range of combined decimation factors available.

In the second stage, the intermediate data signal having intermediate data rate R' is sent to a sub-sampling unit that includes a switch. The switch sub-samples the intermediate data signal at a sub-sampling rate P to generate a final data signal having a final data rate R", where $$R'' = \frac{R'}{P} = \frac{R}{(N \times P)}.$$

The combined decimation factor is thus (N×P).

The coefficients applied to condition the initial data signal can be the FIR filter coefficients needed for decimation of the initial data rate to the final data rate. These coefficients can be calculated and/or otherwise generated by a coefficient generator (for example, a FIR filter compiler or other generator) as needed or, if the range and values of combined decimation factors is known in advance, the coefficients can be calculated in advance and stored in a memory to which the base decimation unit has access.

The value of the sub-sampling rate P can be adjusted to allow for a range of combined decimation rates corresponding to the available range of combined decimation factors (N×P). In some embodiments of the invention, the base decimation factor N also is adjustable, permitting variations in the number of single rate FIR filters operating in the first stage of the decimation system.

The decimation system can be implemented on a logic device, such as a PLD or an ASIC. Moreover, the combined decimation rate can be adjusted by a user or by another controller such as a computer program or control device.

Further details and advantages of the invention are provided in the following Detailed Description and the associated figures.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which.

DETAILED DESCRIPTION OF THE INVENTION

The following detailed description of the invention will refer to one or more embodiments of the invention, but is not limited to such embodiments. The detailed description is intended only to be illustrative. Those skilled in the art will readily appreciate that the detailed description given herein with respect to the Figures is provided for explanatory purposes as the invention extends beyond these limited embodiments.

The present invention provides a simply implemented structure for offering a range of decimation rates in a PLD or other device. Adjustment of the decimation rate is achieved by using a first stage base decimation factor (a "base decimation factor") from a first stage decimation unit and a second stage, adjustable decimation multiplier factor from a sub-sampling unit that, in combination, permit a variety of combined decimation factors ranging from the base decimation factor alone to a maximum decimation factor equal to the product of the base decimation factor and the maximum sub-sampling unit decimation multiplier factor.

Figure 1:
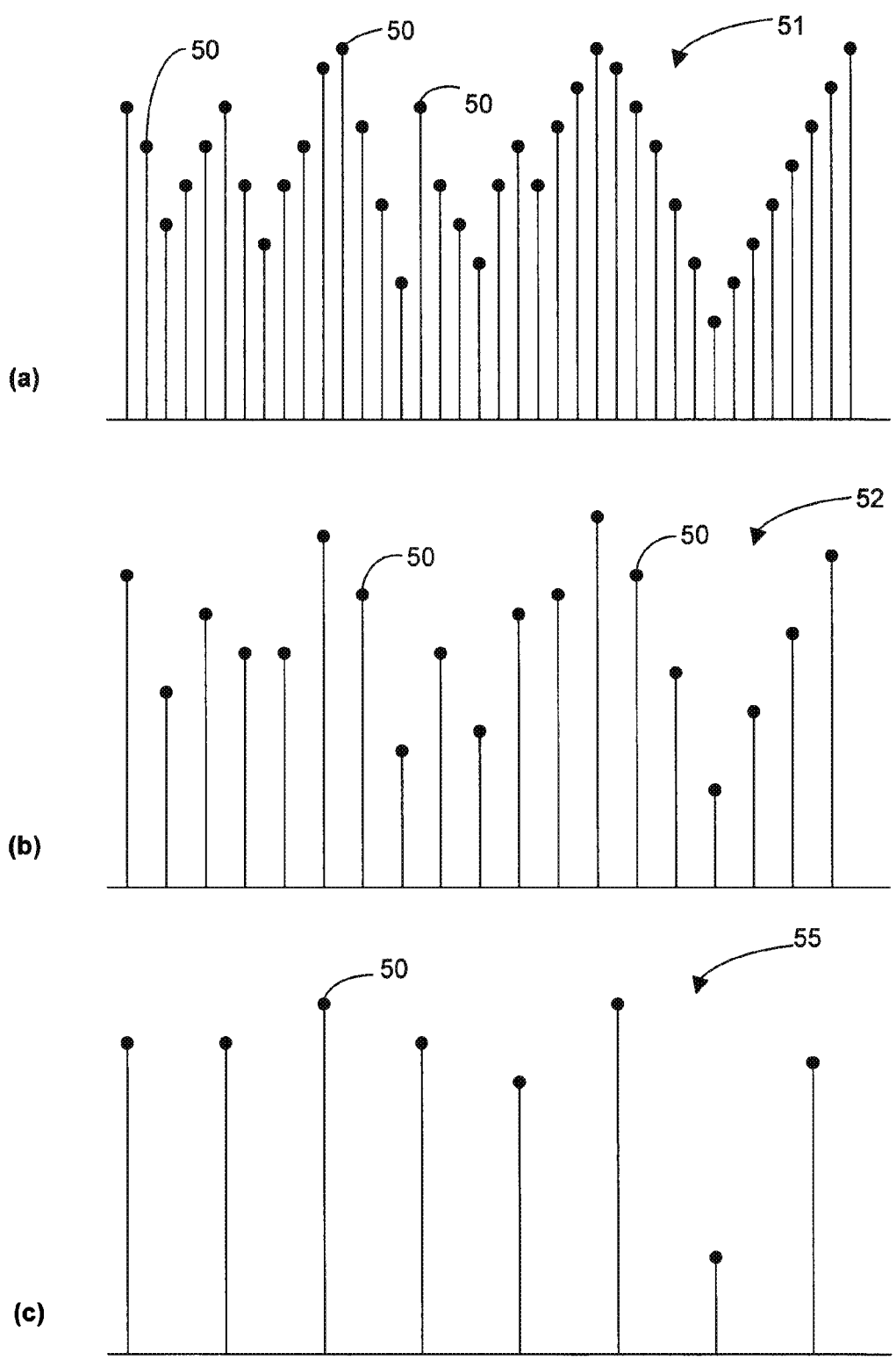
FIG. 1a is an original signal having data points provided at an initial data rate.
FIG. 1b is a decimated signal having the data points of the original signal of FIG. 1a provided at a data rate decimated by deletion by a factor of 2.
FIG. 1c is a decimated signal having the data points of the original signal of FIG. 1a provided at a data rate decimated by deletion by a factor of 5.
Figure 2:
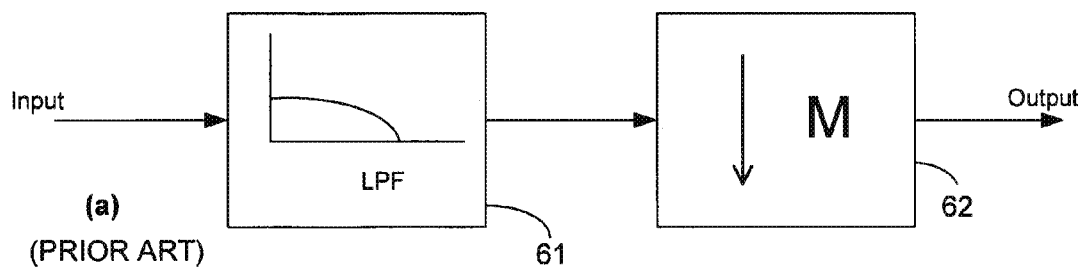
FIG. 2a is a block diagram showing a system for decimating a filtered signal by a factor of M.
FIG. 2b is an original signal having unfiltered data points provided at an initial data rate.
FIG. 2c is the original signal of FIG. 2b having filtered data points provided at the initial data rate.
FIG. 2d is a decimated signal having the filtered data points of the signal of FIG. 2c provided at a data rate after decimation by a factor of 5.
Figure 2:
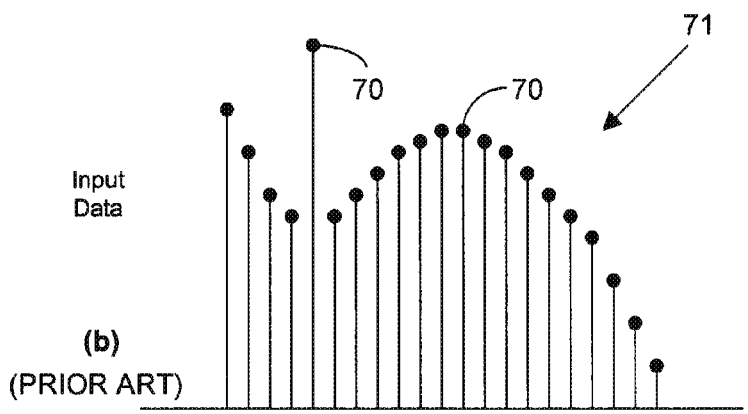
Figure 2:
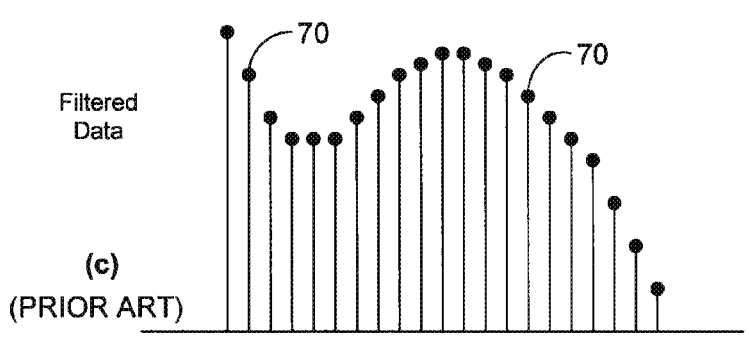
Figure 2:
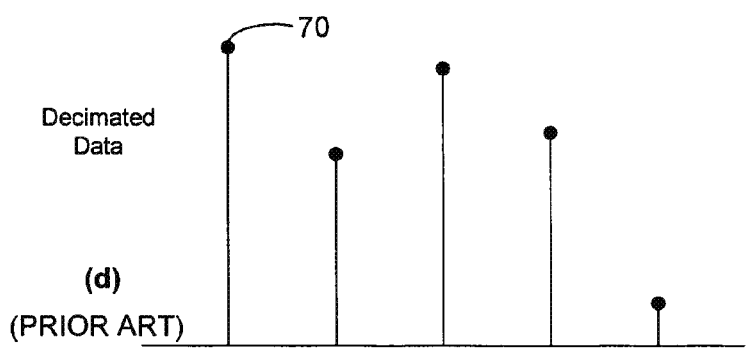
Figure 3:
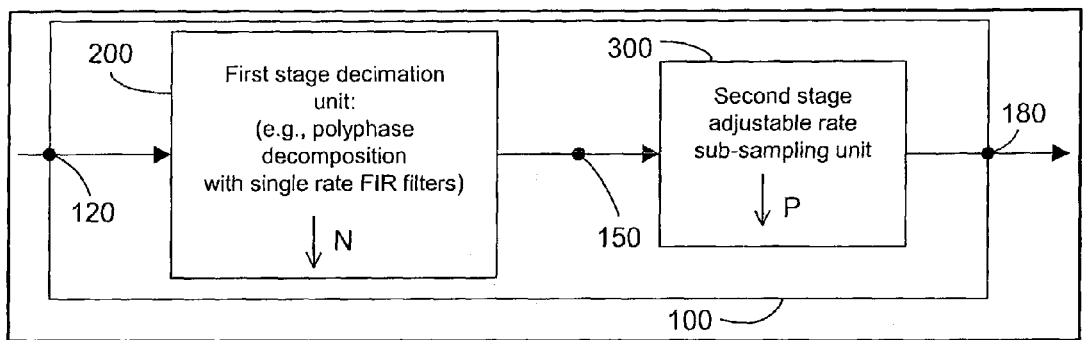
FIG. 3 is a high level block diagram of one embodiment of the present invention showing a first stage decimation unit and an adjustable rate second stage sub-sampling unit.

A high level block diagram of the present invention is shown in FIG. 3. In FIG. 3, the decimating system 100 of the present invention is implemented on or is otherwise part of a digital device 50 (for example, a PLD or other logic device) and includes a first stage decimation unit 200 and a second stage adjustable rate sub-sampling unit 300. An initial data signal enters system 100 at input 120 at an initial data rate of R. The initial data signal is conditioned for decimation to a final data rate R". Thereafter, an intermediate data signal exits decimation unit 200 at intermediate point 150 at a data rate that has been reduced to an intermediate data rate R' by a base decimation factor of N (unless N=1, in which case R=R'). This base decimation factor N is the result of first stage decimation by unit 200. Thereafter, the intermediate data signal enters the sub-sampling unit 300 at data rate R', where the data rate is further reduced to a final data rate R" by a factor of P (unless P=1, in which case R'=R"). Thus, the final data rate R" of the final data signal exiting system 100 at output 180 has been reduced by a combined decimation factor of (N×P).

In one embodiment of the present invention, factor N is a static number dictated by the number of single rate FIR filters implemented in the first stage decimation unit 200. In other embodiments, this base decimation factor N can be variable by varying the number of FIR filters in the first stage unit 200, or in other ways that will be apparent to those skilled in the art. Second stage sub-sampling unit factor P (also referred to herein as the "decimation multiplier factor") is variable and may be changed (for example, at run time) by a user or other controller (for example, a microprocessor or computer determining an optimal data rate for a given function or purpose). In the example shown in FIG. 3, sub-sampling unit 300 can further reduce the data rate by a factor of P which, in one embodiment of the present invention, is an integer value that can vary from 1 to a maximum value $P_{max}$, which can be determined by a user, a PLD designer or another party (for example, the manufacturer of the device on which system 100 is implemented).

Thus, the data rate at input 120 is reduced by a combined decimation factor ranging from a minimum factor of N up to a maximum factor of (N×$P_{max}$). The granularity of the range of decimation factors is dependent upon the base decimation factor N. For example, a system using a static base decimation factor of N=50 and maximum decimation multiplier factor $P_{max}$=6 provides a range of total decimation factors 50, 100, 150, 200, 250, 300 that differ from one another by an incremental value of 50. On the other hand, using N=5 with $P_{max}$=60 provides the same maximum combined decimation factor 300 with an overall range of combined decimation factors (5, 10, 15, 20, . . . , 295, 300) with finer "tuning" by increments of 5.

Figure 4:
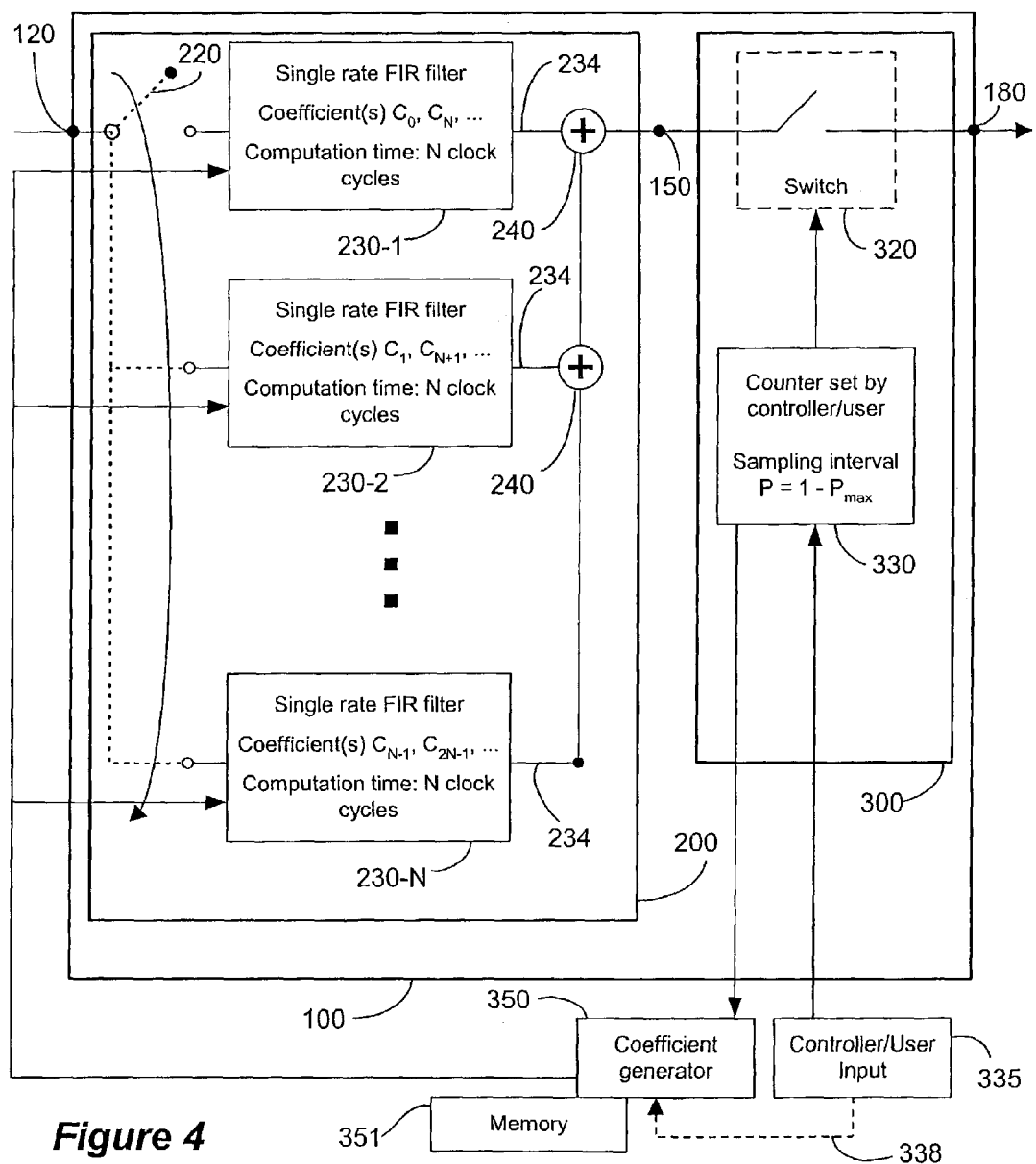
FIG. 4 is a block diagram of a decimation system of the present invention showing a first stage decimation unit and an adjustable rate second stage sub-sampling unit.

A more detailed presentation of the decimation system 100 of the present invention is shown in FIG. 4. The first stage decimation unit 200 is implemented as a polyphase decomposition unit 200 that has N single rate FIR filters 230 (however, any other suitable decimation technique that meets the requirements of the first stage decimation unit functionality in the present invention may be used). An initial data signal having an initial data rate R is delivered to the polyphase decomposition unit 200 via input 120 and a commutator 220. Commutator 220 delivers the first data point to filter 230-1 and incrementally delivers one data point to each filter up to filter 230-N, so that N data points are latched into the filters 230 in one cycle of the commutator 220 (for example, N clock cycles in a PLD). In the embodiment of the present invention shown in FIG. 4, each filter 230 is a single rate FIR filter that multiplies input data points by a set of coefficients to generate a conditioned data signal, where each coefficient set containing one or more calculated, stored or programmed coefficients $C_i$ that are generated and supplied to the filters 230 in any suitable manner. This coefficient multiplication conditions the initial data signal for decimation to the final data rate R". The computation time of each filter 230 is one cycle of the commutator 220 (for example, N clock cycles in a PLD). After coefficient multiplication/conditioning, the product of each data point and its respective coefficient set in each filter 230 exits the filter at an output 234. Adders 240 add the coefficient/data point products at the outputs 234 of the filters 230 to calculate the final decimated data value(s). These decimated output values exit the polyphase decomposition unit 200 as an intermediate data signal and are delivered to intermediate point 150 at an intermediate data rate of R', where:

$$R' = \frac{R}{N}.$$

The data points delivered to point 150 (that is, the intermediate data signal) at data rate R' are input to the sub-sampling unit 300. As seen in FIG. 4, data input to sub-sampling unit 300 are latched at switch 320, using counter 330 to establish the sampling rate of switch 320. In one embodiment of the present invention, the sampling rate of switch 320 can be programmed or adjusted by a user or other controller using counter 330 to be any integer P between 1 and $P_{max}$. In the embodiment of the present invention shown in FIG. 4, switch 320 only passes every $P^{th}$ data point. As a result, the data rate is again reduced (assuming P>1) by another factor of P, providing a final data signal having a final data rate of R" at the output 180 of system 100, where:

$$R'' = \frac{R'}{P} = \frac{R}{(N \times P)}.$$

In earlier polyphase decomposition systems, the coefficients in the filter blocks 230 were calculated to generate data points conditioned for the data rate R' at the output of the polyphase decomposition unit. However, in the present invention, when P>1, coefficients for data decimated from rate R to rate R' are likely (though not necessarily) inappropriate since the final data rate will be R". Therefore, the coefficients used in polyphase decomposition unit 200 must be generated for the final data rate R" and provided to decimation unit 200. In the embodiment of the present invention shown in FIG. 4, this is accomplished using a coefficient generator 350.

In FIG. 4, coefficient generator 350 is shown as being external to the decimation system 100. However, as will be appreciated by those skilled in the art, the coefficient generator may be part of the polyphase decomposition unit 200, part of the sub-sampling unit 300, a separate core or component installed or implemented in device 50, or wholly separate from the device 50 in which system 100 is implemented (for example, in an external computer). For example, the coefficient generator 350 also may be a FIR filter compiler or a memory 351 containing a lookup table with preloaded values for the coefficients corresponding to various values of R". In any event, the coefficient generator 350 obtains the value of P from the counter 330 and, knowing the value of N, calculates the coefficients needed for use in the filters 230. As an example, if N=12 and the counter 330 is set to P=20, then the coefficients calculated by the coefficient generator 350 for use in the 12 single rate FIR filters will be those needed for a total decimation rate of 240, not 12. As seen in FIG. 4, the value P may be sent from a user/controller input 335 to counter 330. The value of P may be sent to the coefficient generator 350 by counter 330 or be sent by a direct link 338.

Figure 5:
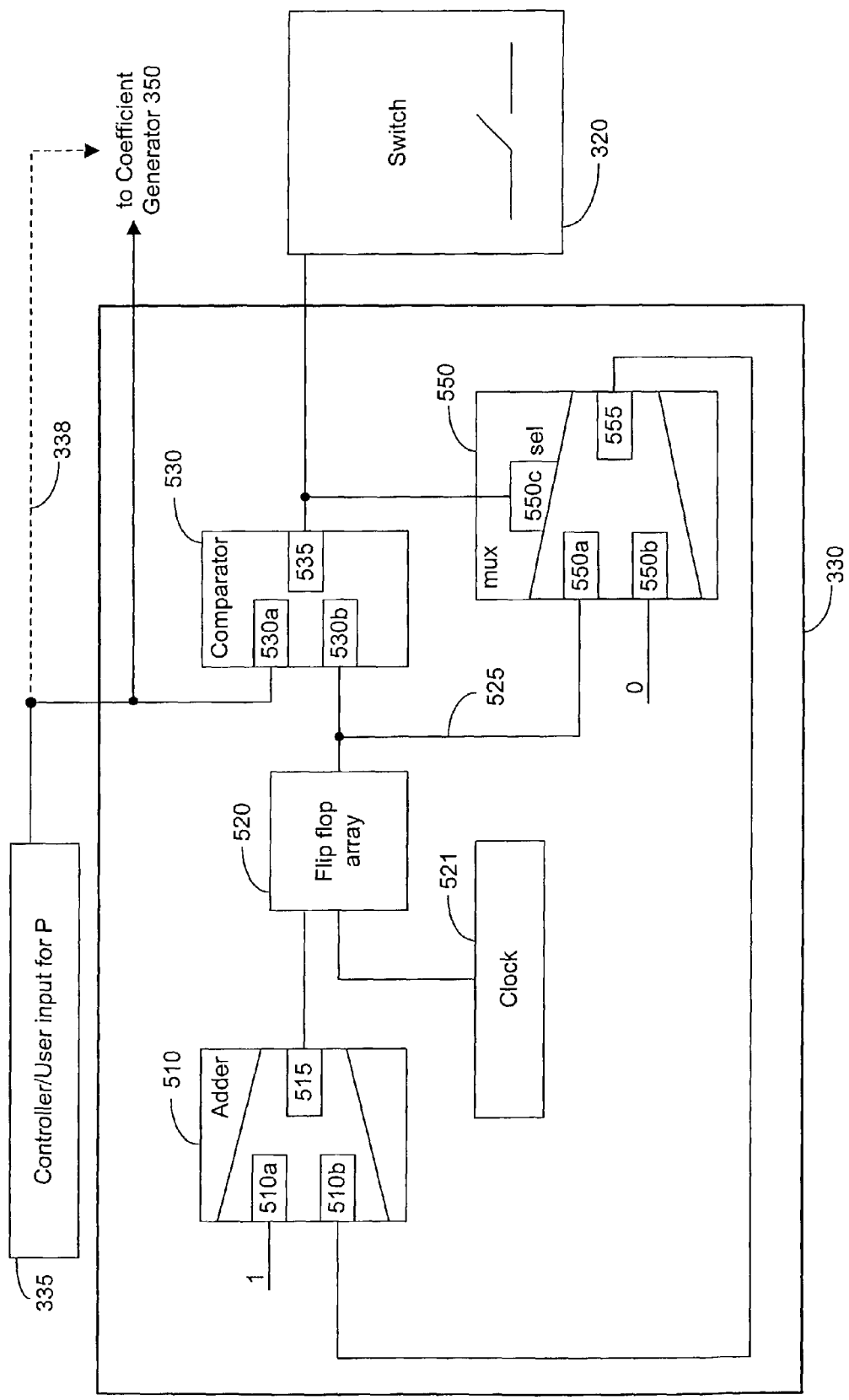
FIG. 5 is a schematic diagram of an implementation of the control logic of the counter of FIG. 4.

A specific embodiment of the control logic of one counter 330 of sub-sampling unit 300 is shown in FIG. 5. However, any suitable counter can be used and alternate embodiments of the counter 330 that are equally useful with the present invention will be apparent to those skilled in the art after reviewing the present disclosure. Input for value P is set at input 335 by a user or other controller controlling final data rate R" (for example, a computer program, a feedback device or circuit, etc.). This value of P can be sent to the coefficient generator 350 via the counter 330 or using a direct link 338. In this embodiment, the value N of the first stage decimation unit 200 is assumed to be fixed. One or more other embodiments, discussed in detail below, may permit programming and/or adjustment of both the base decimation factor N and the decimation multiplier factor P.

In FIG. 5, an adder 510 initializes one input 510b to 0. Input 510a is maintained at a constant 1. The output 515 of adder 510 is the sum of inputs 510a and 510b and is sent to the input of a flip flop array 520, which is controlled by an appropriate clock signal 521. The output 525 of array 520 is sent to input 530b of a comparator 530 and to an input 550a of a multiplexer 550. Another input 550b of multiplexer 550 is set to a constant 0 value which is the reset/initialization value for adder 510. Multiplexer 550 has a third input 550c, which is a select value. When the select value of input 550c is 0, input 550a is passed to the output 555 of the multiplexer 550. When the select value 550c is 1, the multiplexer 550 passes the value of input 550b (thus resetting adder 510 to 0).

Input 530b of comparator 530 is compared to another input 530a, which is the value of P set by the user/controller at 335. When input 530a and input 530b are unequal, the output 535 of comparator 530 is 0. When input 530a equals input 530b, that output value 535 goes to 1. This output 535 is the select value input 550c of multiplexer 550 and is the latching control signal for switch 320. Therefore, when the input 530b (that is, the incrementing count value) equals input 530a (the value of P set by the user/controller), two things happen— (1) the switch 320 closes, passing the then present data point value from point 150 to point 180 in FIG. 4 and (2) the select value input 550c of multiplexer 550 goes to 1, passing input 550b to reset adder input 510b to 0, thus resetting counter 330.

Figure 6:
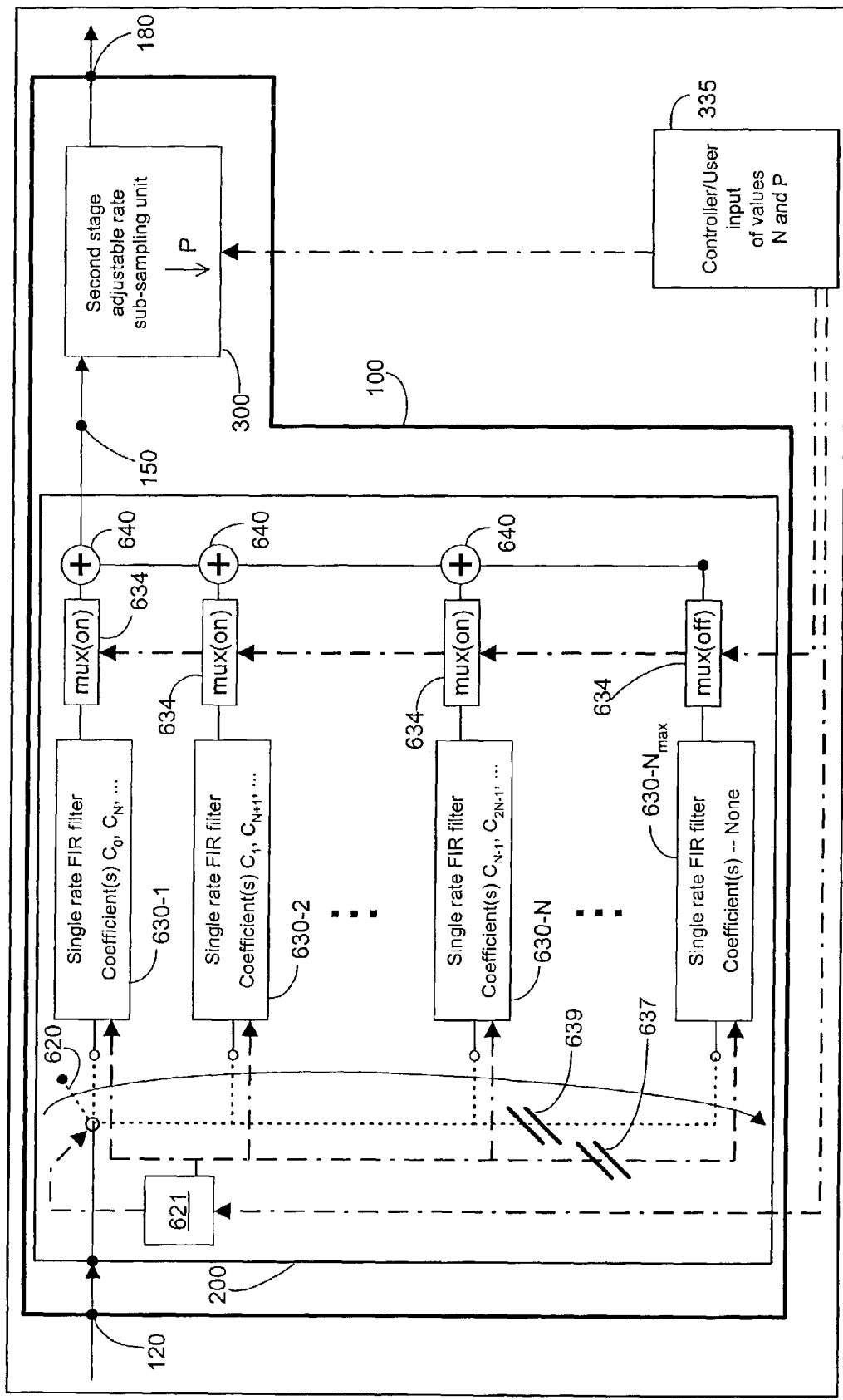
FIG. 6 is a block diagram of a decimation system of the present invention showing an adjustable first stage decimation unit and an adjustable rate second stage sub-sampling unit.

Another embodiment of the decimation system 100 of the present invention is shown in FIG. 6. Sub-sampling unit 300 operates in the same fashion as described above. However, in this embodiment, the base decimation factor N also is adjustable. As seen in FIG. 6, the first stage decimation unit 200 is implemented in this case as a polyphase decomposition unit 200 that has $N_{max}$ total possible single rate FIR filters 630 (again, however, any other suitable decimation technique that meets the requirements of the first stage decimation unit functionality in the present invention may be used). Unlike the static configuration discussed above, the number of filters 630 active for a given stream of data can be altered. In this way, both the base decimation factor N and the decimation multiplier factor P can be adjusted.

The initial data signal having the initial data rate is delivered to the polyphase decomposition unit 200 via input 120 and a commutator 620. In this case commutator 620 is configured by control logic 621 for the value of N input by a user/controller at input 335 (input 335 again is shown as being implemented on the device 50 but outside system 100; again, this input 335 can be on or off of the device 50 and also may or may not be part of the system 100 and/or one of its stages 200 or 300). Commutator 620 delivers data points to filters 630-1 through 630-N, again incrementally delivering one data point to each filter up to filter 630-N, so that N data points are latched into the filters 630 needed for a base decimation factor of N in one cycle of the commutator 620 (again, for example, N clock cycles in a PLD). As seen in FIG. 6, the control logic 621 and commutator 620 may limit themselves by cutting off at 637 and 639, respectively, communication with unused filters 630. The computation time of each filter 630 also can be set and/or adjusted, if necessary, by the control logic 621, which can set each filter's computation time to an appropriate period (for example, one cycle of the commutator, such as N clock cycles in a PLD). However, in some embodiments of the present invention, the normal computation time of one of the single rate filters 630 is less than the smallest available value of N, thus making reconfiguration or adjustment of the computation time of each filter 630 unnecessary.

In the embodiment of the present invention shown in FIG. 6, each single rate FIR filter 630 conditions the initial data signal by multiplying the initial data signal's data points by a set of coefficients to generate a conditioned data signal, where each coefficient set containing one or more programmed coefficients $C_i$. However, since only N filters filter 630 are being used, any filters above filter 630-N do not perform any conditioning and/or decimating functions, and therefore are not programmed with such coefficients. After coefficient multiplication/conditioning, the product of each data point and its respective coefficient in each active filter 630 exits the filter and is input into a multiplexer 634.

Each multiplexer 634 is configured to generate the output of its associated filter 630 if the multiplexer is active or "on" (that is, if it is associated with one of the first N filters being used to condition and decimate the initial data signal in the first stage) and to generate a 0 if the multiplexer is inactive or "off" (that is, if the multiplexer is associated with a filter 630 that has an index greater than N and is thus unneeded for the base decimation function). The "on" and "off" status of the multiplexers 634 again can be controlled by input 335. The specific configuration of the multiplexers 634 and their control is a matter of design choice and the various techniques for implementing these functions will be apparent to those skilled in the art.

Adders 640 add the coefficient/data point products of the multiplexers 634 of filters 630 to calculate the intermediate data signal data value(s). No special active/inactive ("on"/ "off") consideration is given to the adders 640, since the output of each unused filter 630 (filters 630-N+1 and above), if any, will be the 0 output of its associated multiplexer 634. The decimated output values exit the polyphase decomposition unit 200 and are delivered to intermediate point 150 as the intermediate data signal having an intermediate data rate of R', as discussed in more detail above. However, the base decimation factor N is now variable, so that N can be selected and/or adjusted, in one embodiment of the present invention, from the range of integers between and including 1 through N. This allows a user or designer to configure a variable decimation system 100 that has the desired level of granularity (based on the base decimation factor N), while permitting a range of final data rates and combined decimation factors based on the range of base decimation factors (that is, for example, 1 through $N_{max}$) and the range of the decimation multiplier factors (that is, for example, 1 through $P_{max}$). That range can be 1 through ($N_{max} \times P_{max}$).

Figure 7:
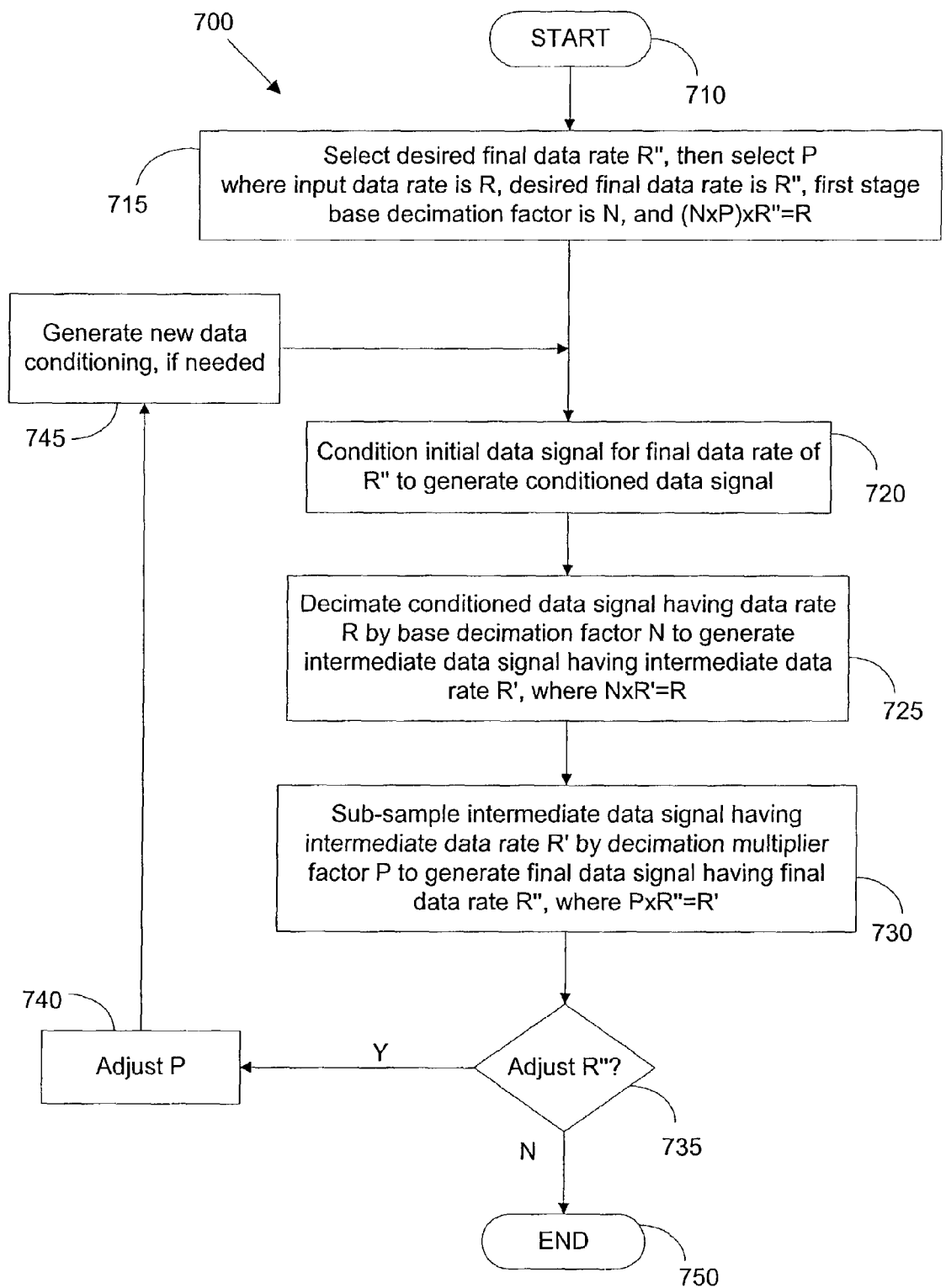
FIG. 7 is a process flow diagram illustrating a method for adjustably decimating a data signal in accordance with an embodiment of this invention.

As a further example, FIG. 7 is a flow diagram illustrating one embodiment of the present invention. The flow diagram of FIG. 7 does not require that the system checks for certain actions by event loops or polling. Thus, any process(es) presented herein should not be read to imply that the system necessarily checks for events in the manner and order listed. While this example provides those skilled in the art with an understanding of one or more methodologies of the present invention and an understanding of its use in other contexts, the example presented in FIG. 7 is not to be interpreted as being limited in any way.

The method 700 of decimating a data signal starts at 710. This starting step 710 may include programming a PLD or other device using a configuration bitstream or in any other suitable manner. At 715, user or other controller selects a desired final data rate R" for the initial data signal being decimated. Based on this selected final data rate R", either the user/controller or the decimation system itself selects a decimation multiplier factor P based on the base decimation factor N and the initial and final data rates, R and R", respectively. In the embodiment of the present invention shown in FIG. 7, the base decimation factor N is assumed to be static. Therefore, the initial data rate R is a multiple of R" and of (N×P), where P can be selected and adjusted by a user/controller. If a final data rate R" is selected that is not evenly divisible by R and N, the user/controller can be prompted to make another selection after being advised of the available combined decimation factors or the system can select the final data rate closest to the final data rate chosen by the user/controller. In another embodiment of the present invention, the system may only allow the user/controller to select from a list of available final data rates and/or combined decimation factors as the final data rate selection step 715.

Once R" and P have been selected, the initial data signal is input to the first stage base decimation unit at 720. At this stage, the data points of the initial data signal are conditioned for the final data rate R" (for example, multiplication by appropriate coefficients). Thereafter, at 725, the data points of the initial data signal are decimated by a factor of N and are output from the first stage decimation unit at the intermediate data rate of R'. The data points of the intermediate data signal, having an intermediate data rate R', are input to the sub-sampling unit, where the intermediate data signal is sub-sampled at 730 and thereafter output as the final data signal having final data rate R". At 735 the user/controller can decide whether final data rate R" needs adjustment. If so, then the decimation multiplier factor P can be adjusted at 740. This reconfigures the sub-sampling unit decimation multiplier factor and generates new coefficients and/or other conditioning at 745, if necessary, for the new final data rate achieved using decimation multiplier factor P, as adjusted.

Figure 8:
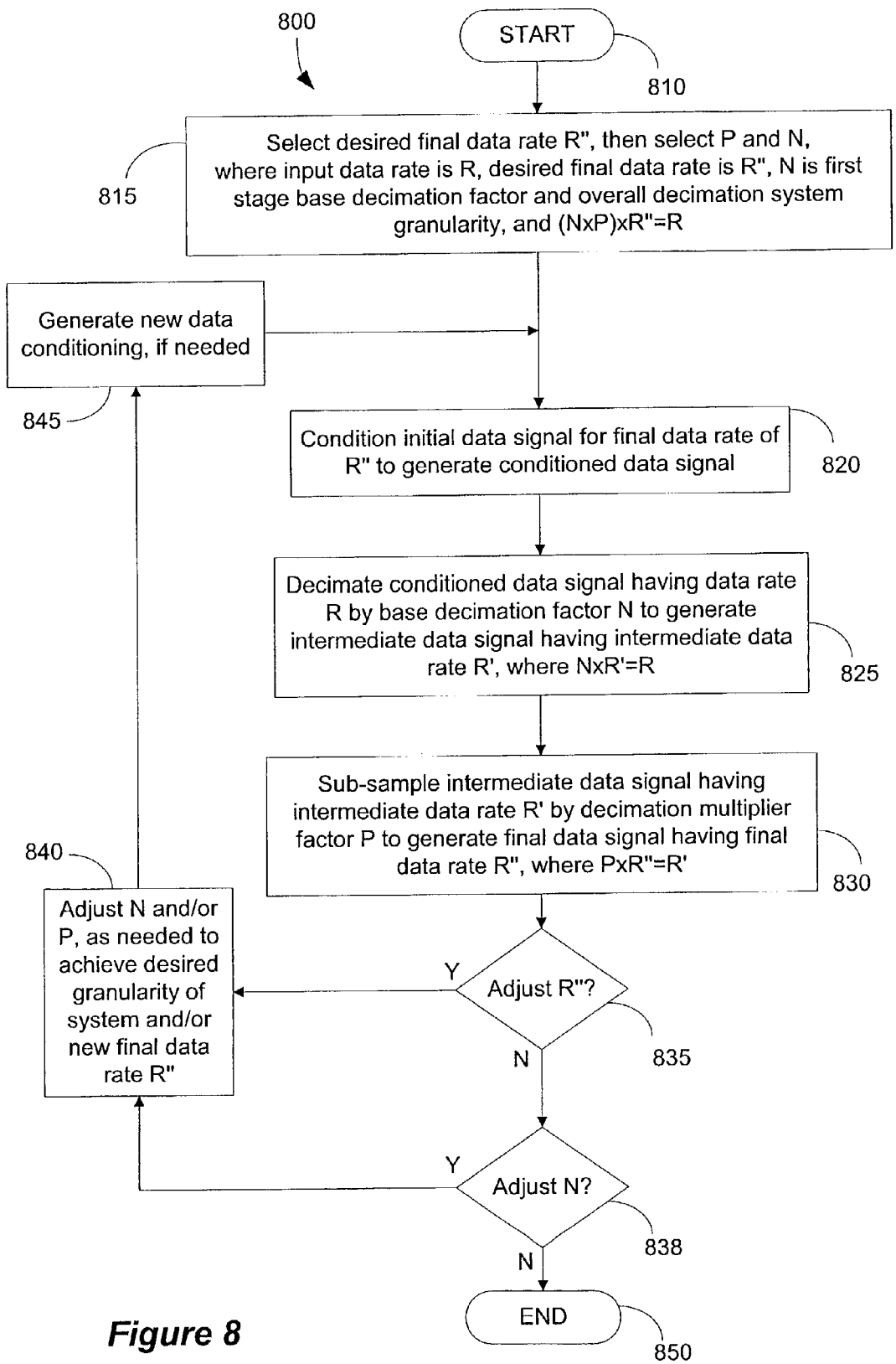
FIG. 8 is a process flow diagram illustrating a method for adjustably decimating a data signal in accordance with an embodiment of this invention.

If N is adjustable, for example as shown in the system of FIG. 6, then the methodology changes slightly, as seen in FIG. 8. Again, after starting at 810 (again, possibly including configuration of a PLD or other device), the desired final data rate R" is selected at 815. However, unlike the situation in which N is static, the base decimation factor N also is adjustable, allowing for varying levels of decimation system granularity. Therefore, as part of the selection of final data rate R", the user/controller selects both N and P from the available values. Thereafter, the method proceeds to condition the data points of the initial data signal at 820, decimate the conditioned data signal having initial data rate R by the base decimation factor N to output the intermediate data signal having intermediate data rate R' at 825, and finally sub-sample the intermediate data signal input at intermediate data rate R' by the decimation multiplier factor P to output the final data signal having final data rate R" at 830.

Again, if the user/controller wishes to adjust the final data rate R", that selection can be made at 835. However, the user/controller may wish to adjust the system granularity N and can do so at 838. If either adjustment is to be made, then N and/or P can be adjusted as desired at 840. New data conditioning (including, but not limited to, new coefficients, activation or deactivation of single rate filters in the base decimation unit, adjustment of single rate filter computation times, and adjustment of the data delivery system (for example, a commutator) to accommodate new data conditioning) can then be implemented at 845. If no adjustments to the final data rate R" or the granularity/base decimation factor N are desired or required, the method ends at 850.

Generally, embodiments of the present invention employ various processes involving data stored in or transferred through one or more computer systems. Embodiments of the present invention also relate to a hardware device or other apparatus for performing these operations. This apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. A particular structure for a variety of these machines will be apparent to those of ordinary skill in the art based on the description given below.

Embodiments of the present invention as described above employ various process steps involving data stored in computer systems. These steps are those requiring physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, bitstreams, data signals, values, elements, variables, characters, data structures, or the like. It should be remembered, however, that all of these and similar terms are to be associated with the appropriate physical quantities and are merely convenient labels applied to these quantities.

Further, the manipulations performed are often referred to in terms such as identifying, fitting, or comparing. In any of the operations described herein that form part of the present invention these operations are machine operations. Useful machines for performing the operations of embodiments of the present invention include general purpose digital computers or other similar devices. In all cases, there should be borne in mind the distinction between the method of operations in operating a computer and the method of computation itself. Embodiments of the present invention relate to method steps for operating a computer in processing electrical or other physical signals to generate other desired physical signals.

Embodiments of the present invention also relate to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 9:
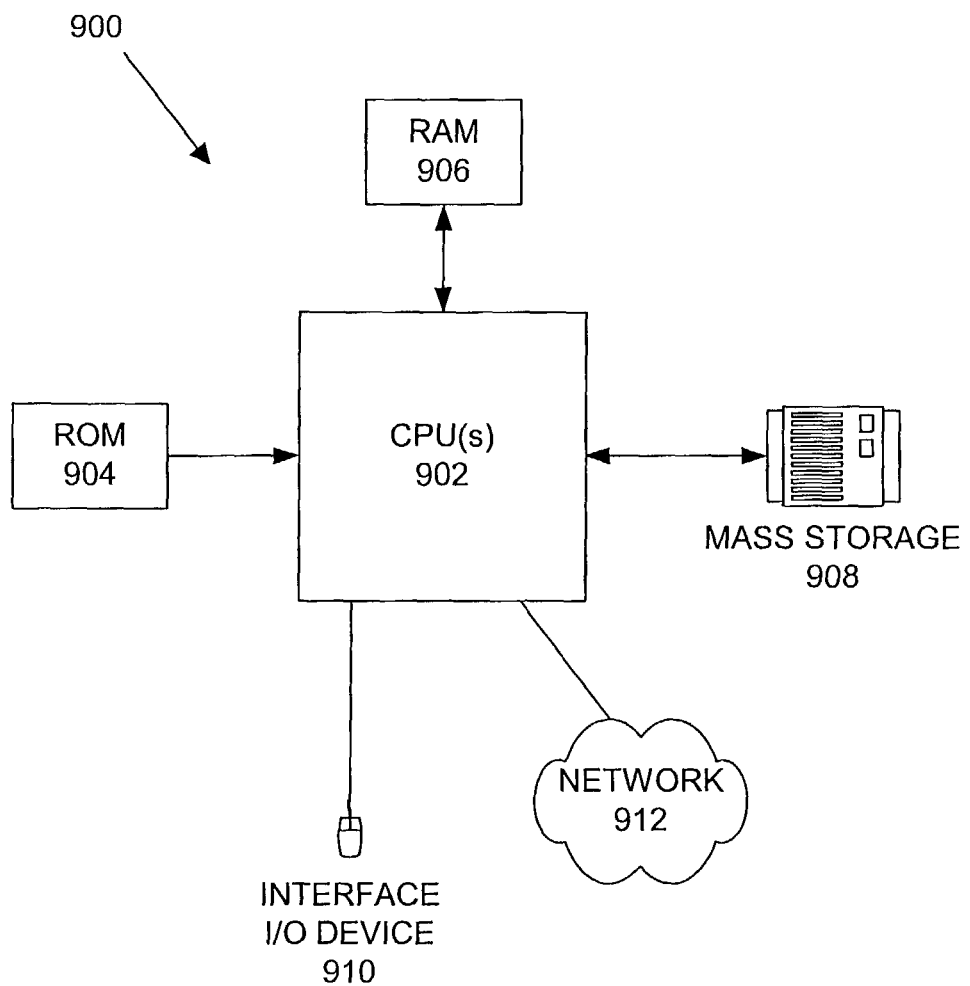
FIG. 9 is a block diagram of a typical computer system suitable for implementing an embodiment of the present invention.

FIG. 9 illustrates a typical computer system that can be used by a user and/or controller in accordance with one or more embodiments of the present invention. The computer system 900 includes any number of processors 902 (also referred to as central processing units, or CPUs) that are coupled to storage devices including primary storage 906 (typically a random access memory, or RAM), primary storage 904 (typically a read only memory, or ROM). As is well known in the art, primary storage 904 acts to transfer data and instructions uni-directionally to the CPU and primary storage 906 is used typically to transfer data and instructions in a bi-directional manner. Both of these primary storage devices may include any suitable of the computer-readable media described above. A mass storage device 908 also is coupled bi-directionally to CPU 902 and provides additional data storage capacity and may include any of the computer-readable media described above. The mass storage device 908 may be used to store programs, data and the like and is typically a secondary storage medium such as a hard disk that is slower than primary storage. It will be appreciated that the information retained within the mass storage device 908, may, in appropriate cases, be incorporated in standard fashion as part of primary storage 906 as virtual memory. A specific mass storage device such as a CD-ROM 914 may also pass data uni-directionally to the CPU.

CPU 902 also is coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. The above-described devices and materials will be familiar to those of skill in the computer hardware and software arts.

Figure 10:
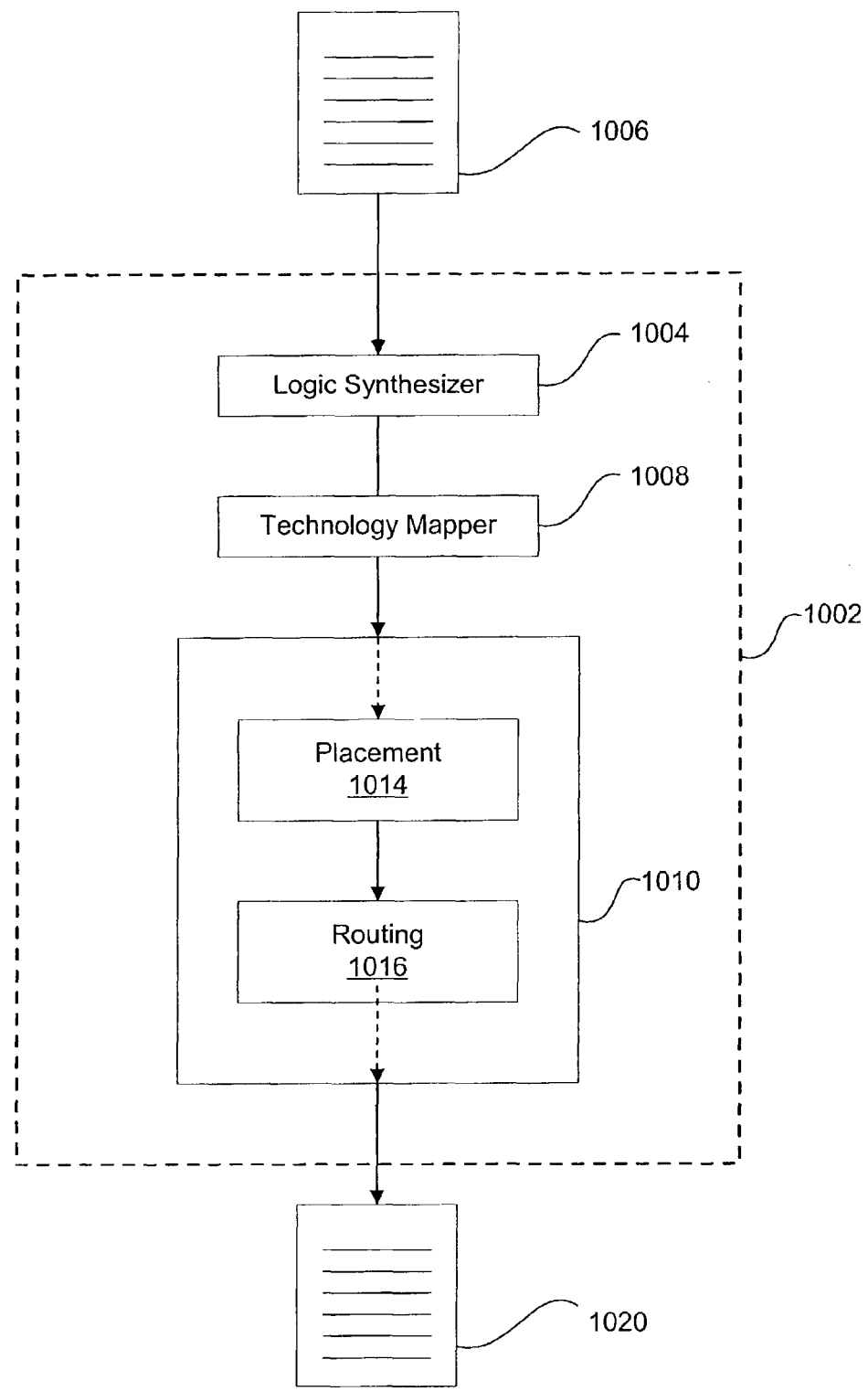
FIG. 10 is a block diagram showing modules that may be employed in a PLD design compiler of this invention.

The hardware elements described above may define multiple software modules for performing the operations of this invention. For example, instructions for running a compiler (such as a FIR filter compiler) may be stored on mass storage device 908 or 914 and executed on CPU 902 in conjunction with primary memory 906. In a preferred embodiment, the compiler is divided into software submodules. Referring to FIG. 10, a compiler 1002 includes a logic synthesizer 1004 which creates a synthesized netlist from a user's high level electronic design 1006. Compiler 1002 also includes a technology mapper 1008 which maps gates from the synthesized netlist into logic cells. Finally, compiler 1002 includes a place and route module 1010 which in turn includes a placement module 1014 and a routing module 1016. Placement module 1014 places logic cells onto specific logic elements of a target hardware device. Routing module 1016 connects wires between the inputs and outputs of the various logic elements in accordance with the logic required to implement the electronic design. Compiler 1002 outputs a compiled design 1020. It should be understood that other compiler designs may be employed with this invention. For example, some compilers will include a partitioning module to partition a technology mapped design onto multiple hardware entities. In addition, the compiler may be adapted to handle hierarchical designs, whereby synthesis, mapping, etc. are performed recursively as the compiler moves down branches of a hierarchy tree. Additional details of compiler software for PLDs may be found in U.S. patent application Ser. No. 08/958,670, naming D. Mendel as inventor, and entitled "PARALLEL PROCESSING FOR COMPUTER ASSISTED DESIGN OF ELECTRONIC DEVICES."

Figure 11:
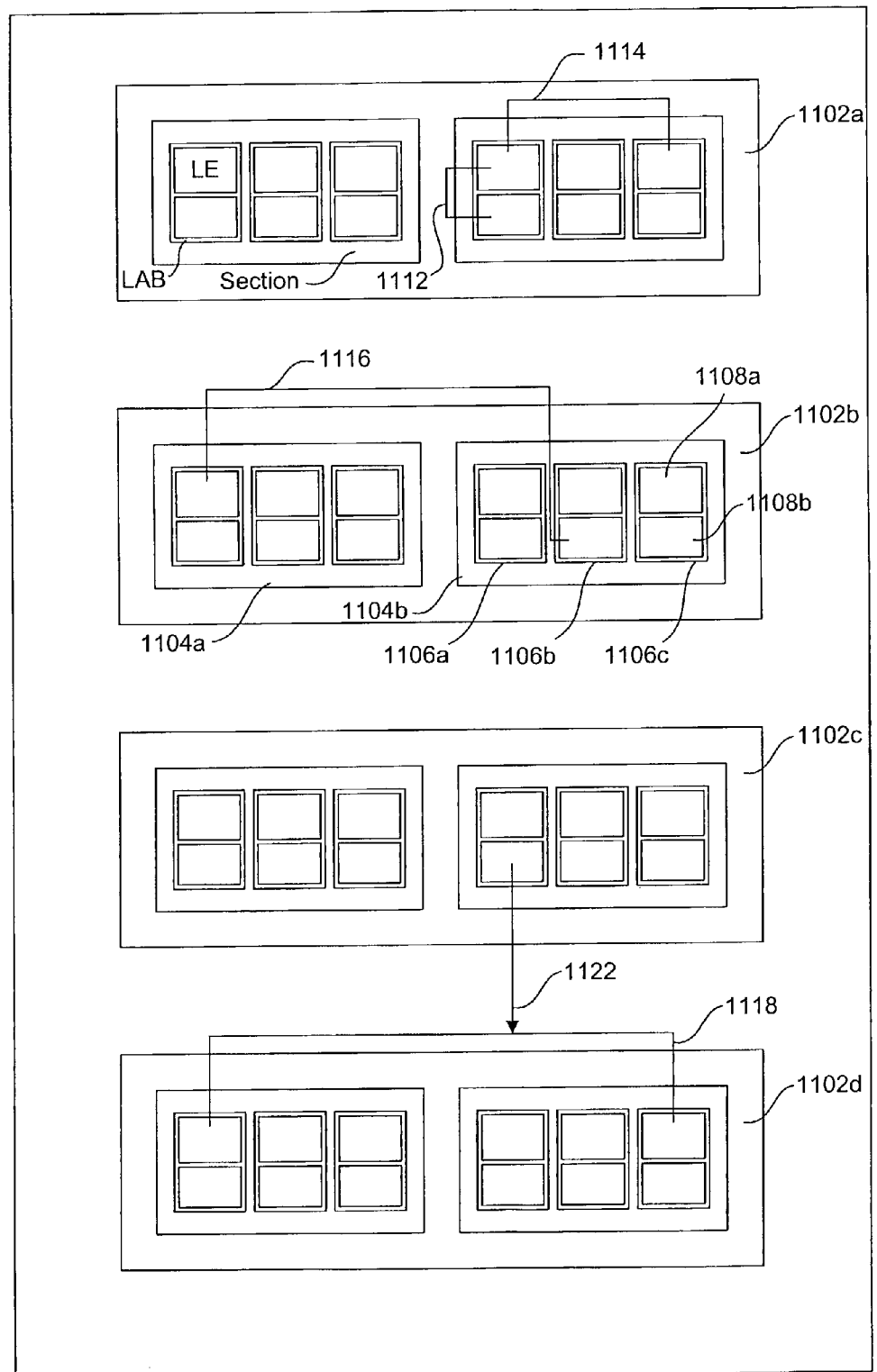
FIG. 11 is an idealized block representation of the architecture of an arbitrary hardware device, including interconnects, which may be employed in fitting gates from a synthesized sub-netlist generated in accordance with this invention.

The form of a compiled design may be further understood with reference to a hypothetical target hardware device having multiple hierarchical levels. Such a hardware device is represented in FIG. 11. This idealized representation roughly conforms to the layout of a FLEX 10K programmable logic device available from Altera Corporation of San Jose, Calif. In FIG. 11, a programmable logic device 1100 is segmented into a plurality of "rows" to facilitate interconnection between logic elements on a given row. In the hypothetical example shown, there are four rows: 1102*a*, 1102*b*, 1102*c*, and 1102*d*.

Each row of programmable logic device 1100 is further subdivided into two "half-rows." For example, row 1102*b* is shown to contain a half-row 1104*a* and a half-row 1104*b*. The next lower level of the hierarchy is the "logic array block" (LAB). Half-row 1104*b*, for example, contains three LABs: an LAB 1106*a*, an LAB 1106*b*, and an LAB 1106*c*. Finally, at the base of the of the hierarchy are several logic elements. Each such logic element exists within a single logic array block. For example, LAB 1106*c* includes two logic elements: a logic element 1108*a* and a logic element 1108*b*.

In short, PLD 1100 includes four hierarchical levels: (1) rows, (2) half-rows, (3) LABs, and (4) logic elements (LEs). Any logic element within PLD 1100 can be uniquely specified (and located) by specifying a value for each of these four levels of the containment hierarchy. For example, logic element 1108b can be specified as follows: row (2), half-row (2), LAB (3), LE (2).

To fit a logic design onto a target hardware device such as that shown in FIG. 11, a synthesized netlist is divided into logic cells (typically containing one or more gates) which are placed in the various logic elements as uniquely defined above. Thus, each logic cell from the synthesized netlist resides in a unique single logic element.

Often, a multi-level hardware hierarchy such as that shown in PLD 1100 includes multiple levels of routing lines (interconnects). These connect the uniquely placed logic cells to complete circuits. In PLD 1100, for example, four levels of interconnect are provided, one for each of the four hierarchy levels. First a local interconnect such as interconnect 1112 is employed to connect two logic elements within the same LAB. At the next level, a LAB-to-LAB interconnect such as interconnect 1114 is employed to connect two LABs within the same half-row. At the next higher level, a "global horizontal" interconnect is employed to connect logic elements lying in the same row but in different half-rows. An example of a global horizontal interconnect is interconnect 1116 shown in row 1102b. Another global horizontal interconnect is shown as interconnect 1118, linking logic elements within row 1102d. Finally, a "global vertical" interconnect is employed to link a logic element in one row with a logic element in a different row. For example, a global vertical interconnect 1122 connects a logic element in the first LAB of the second half-row of row 1102c to two separate logic elements in row 1102d. In the embodiment shown, this is accomplished by providing global vertical interconnect 1122 between the above-described logic element in row 1102c to global horizontal interconnect 1118 in row 1102d. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths must be evaluated to determine which is best for the design being fit.

The interconnect structure and overall architecture of the Altera FLEX 10K family of PLDs is described in much greater detail in U.S. Pat. No. 5,550,782, issued on Aug. 27, 1996, naming Cliff et al. as inventors, and entitled "PROGRAMMABLE LOGIC ARRAY INTEGRATED CIRCUITS." That patent is incorporated herein by reference for all purposes. Additional discussion of the FLEX 10K and other PLD products may be found in other publications from Altera Corporation of San Jose, Calif.

Briefly, in the FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ASICs that can benefit from application of the present invention.

Figure 12:
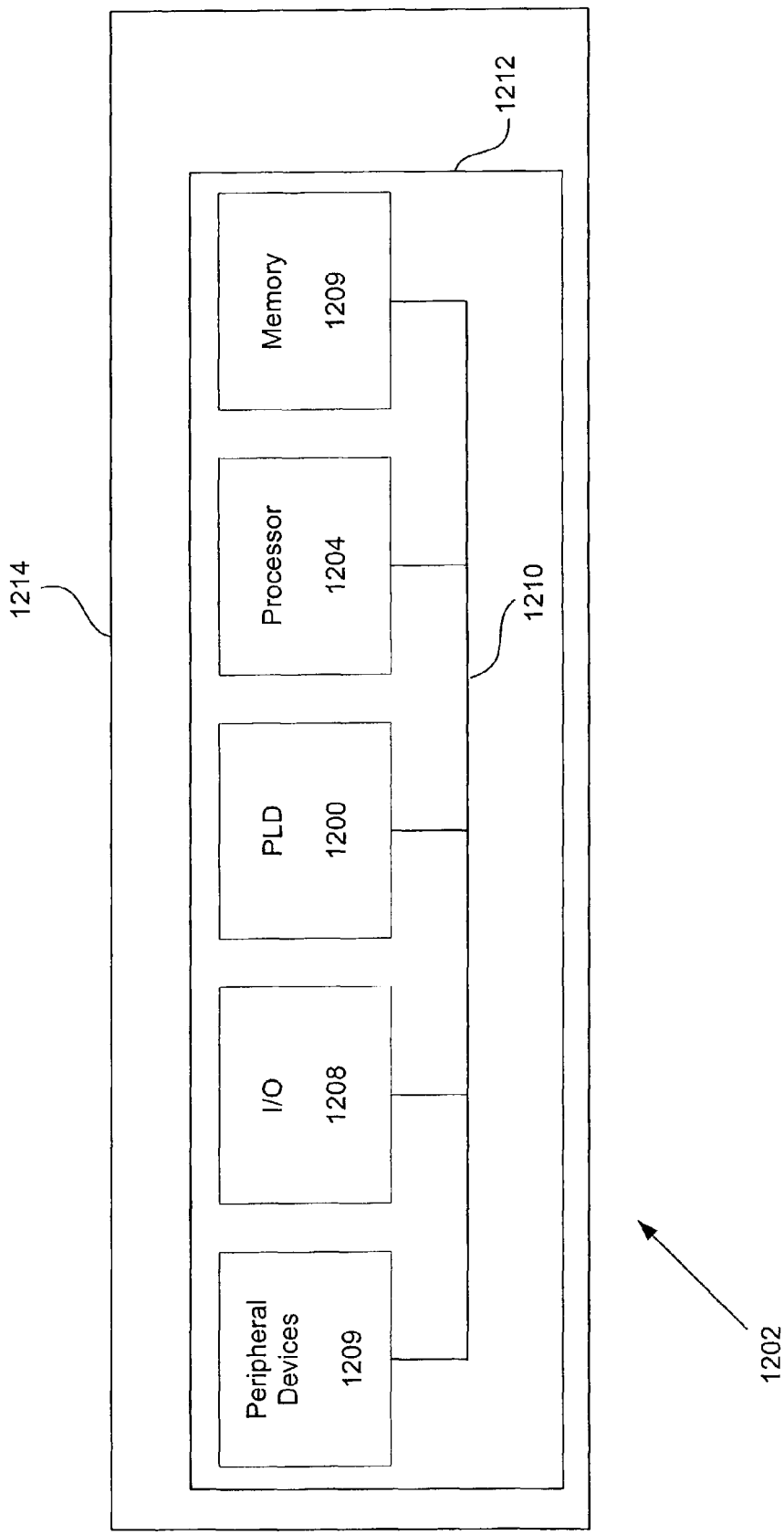
FIG. 12 is a block diagram depicting a system containing a PLD prepared in accordance with this invention.

This invention also relates to programmable logic devices programmed with a design prepared in accordance with the above described methods. The invention further relates to systems employing such programmable logic devices. FIG. 12 illustrates a PLD 1200 of the present invention in a data processing system 1202. The data processing system 1202 may include one or more of the following components: a processor 1204; memory 1206; I/O circuitry 1208; and peripheral devices 1209. These components are coupled together by a system bus 1210 and are populated on a circuit board 1212 which is contained in an end-user system 1214.

The system 1202 can be used in a wide variety of applications, such as computer networking, data networking, instrumentation, video processing, digital signal processing, or any other application where the advantage of using reprogrammable logic is desirable. The PLD 1200 can be used to perform a variety of different logic functions.

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation as illustrated and described. Therefore, the described embodiments should be taken as illustrative and not restrictive, and the invention should not be limited to the details given herein but should be defined by the following claims and their full scope of equivalents, whether foreseeable or unforeseeable now or in the future.

What is claimed is:

1. A digital device for decimating an initial data signal having an initial data rate R, to a final data signal having a final data rate R", the digital device comprising:
   a coefficient generator configurable to calculate a plurality of coefficients, wherein the calculating is based on the final data rate R" and a sampling rate P;
   a decimation unit comprising a plurality of filters configurable to:
      condition the initial data signal to generate a conditioned data signal conditioned for decimation to the final data rate R", wherein the plurality of filters conditions the initial data signal by multiplying data points in the initial data signal by the plurality of coefficients; and
      decimate the conditioned data signal having the initial data rate R using a base decimation factor N to generate an intermediate data signal having an intermediate data rate R'; and
   a sampling unit configurable to sample the intermediate data signal having the intermediate data rate R', wherein said sampling unit is configurable to use the sampling rate P to generate the final data signal having the final data rate R".

2. The digital device of claim 1, wherein the coefficient generator is configurable to calculate the plurality of coefficients responsive to a change in the sampling rate P.

3. The digital device of claim 1, wherein the sampling unit comprises:
   a switch configurable to sample the intermediate data signal using the sampling rate P; and
   a comparator coupled with the switch, the comparator configurable to determine, based on the sampling rate P, whether the switch passes a data point of the intermediate data signal to an output line.

4. The digital device of claim 1, wherein the sampling rate P is adjustable.

5. The digital device of claim 4, wherein the sampling rate P is adjustable at runtime.

6. The digital device of claim 1, wherein the sampling rate P is adjustable by a user or a controller.

7. The digital device of claim 1, wherein all coefficients of the plurality of coefficients corresponding to all available values of N and P are generated by the coefficient generator and stored in a memory.

8. The digital device of claim 1, wherein the decimation unit is configurable to generate the intermediate data signal based on adjustment of a computation time of a filter of the plurality of filters, a change in a coefficient of the plurality of coefficients, an activation of a filter of the plurality of filters, or a deactivation of a filter of the plurality of filters.

9. The system of claim 1, wherein the sampling rate changes when the final data rate changes.

10. A method of processing an initial data signal having an initial data rate R to produce a final data signal having a final data rate R", the method comprising:
calculating, with a digital device comprising a programmable logic device or other logic device, a plurality of coefficients based on the final data rate R" and a sampling rate P; and, with the digital device:
generating an intermediate data signal having an intermediate data rate R' from the initial data signal by:
conditioning the initial data signal to generate a conditioned data signal having data conditioned for decimation to the final data rate R", wherein said conditioning of the initial data signal comprises multiplying data points in the initial data signal by the plurality of coefficients, the plurality of coefficients corresponding to the final data rate R", and
decimating the conditioned data signal by a base decimation factor N to generate the intermediate data signal having the intermediate data rate R'; and
sampling the intermediate data signal by using the sampling rate P to generate the final data signal having the final data rate R".

11. The method of claim 10, wherein the coefficient generator is configurable to calculate the plurality of coefficients responsive to a change in the sampling rate P.

12. The method of claim 10, wherein said sampling comprises:
determining, based on the sampling rate P, whether to output a data point of the intermediate data signal; and
transmitting the data point of the intermediate data signal in response to said determining.

13. The method of claim 10, wherein said generating the intermediate data signal is performed based on an adjustment of a computation time of a filter of a plurality of filters, a change in a coefficient of the plurality of coefficients, an activation of a filter of the plurality of filters, or a deactivation of a filter of the plurality of filters.

14. The method of claim 10, wherein the sampling rate P is adjustable at runtime.

15. A logic device for decimating an initial data signal having an initial data rate R, to a final data signal having a final data rate R", the logic device comprising:
a programmable logic device or other logic device;
means for calculating a plurality of coefficients, wherein the calculating is based on the final data rate R" and a sampling rate P;
means for generating an intermediate data signal having an intermediate data rate R' from the initial data signal by:
conditioning the initial data signal to generate a conditioned data signal having data conditioned for decimation to the final data rate R", wherein said conditioning of the initial data signal comprises multiplying data points in the initial data signal by the plurality of coefficients, the plurality of coefficients corresponding to the final data rate R", and
decimating the conditioned data signal by a base decimation factor N to generate the intermediate data signal having the intermediate data rate R';
means for sampling the intermediate data signal by using a sampling rate P to generate the final data signal having the final data rate R".

16. The logic device of claim 15, wherein the means for calculating calculates the plurality of coefficients responsive to a change in the sampling rate P.

17. The logic device of claim 15, further comprising:
means for outputting, wherein the means for sampling comprises:
means for determining, based on the sampling rate P, whether to pass a data point of the intermediate data signal to the means for outputting; and
means for transmitting the final data signal to the means for outputting based on the determination whether to pass the data point.

18. The logic device of claim 15, wherein the means for generating the intermediate data signal includes a plurality of means for filtering, wherein the means for generating the intermediate data signal responds to an adjustment of a computation time of one of the plurality of means for filtering, responds to a change in one of the plurality of coefficients, responds to an activation of one of the plurality of means for filtering, or responds to a deactivation of one of the plurality of means for filtering.

19. A non-transitory computer-readable medium for processing an initial data signal having an initial data rate R, to a final data signal having a final data rate R", the non-transitory computer-readable medium including a set of instructions that causes a computer to perform a method comprising:
calculating a plurality of coefficients, wherein the calculating is based on the final data rate R" and a sampling rate P;
generating an intermediate data signal having an intermediate data rate R' from the initial data signal by:
conditioning the initial data signal to generate a conditioned data signal having data conditioned for decimation to the final data rate R", wherein said conditioning of the initial data signal comprises multiplying data points in the initial data signal by the plurality of coefficients, the plurality of coefficients corresponding to the final data rate R", and
decimating the conditioned data signal by a base decimation factor N to generate the intermediate data signal having the intermediate data rate R'; and
sampling the intermediate data signal by using the sampling rate P to generate the final data signal having the final data rate R".

20. The non-transitory computer-readable medium of claim 19, wherein said calculating is performed responsive to a change in the sampling rate P.

21. The non-transitory computer-readable medium of claim 19, wherein sampling comprises:
determining, based on the sampling rate P, whether to output a data point of the intermediate data signal; and
transmitting the data point of the intermediate data signal in response to said determining.

22. The non-transitory computer-readable medium of claim 19, wherein generating the intermediate data signal is performed based on an adjustment of a computation time of a filter of a plurality of filters, a change in a coefficient of the plurality of coefficients, an activation of a filter of the plurality of filters, or a deactivation of a filter of the plurality of filters.

23. The non-transitory computer-readable medium of claim 19, wherein the sampling rate P is adjustable at runtime.

24. A logic device for providing a plurality of coefficients to be used in generating an intermediate data signal having an intermediate data rate from an initial data signal having an initial data rate, the intermediate data signal subsequently decimated to produce a final data signal with a final data rate, the logic device comprising:
- a receiving component configurable to receive the final data rate and a sampling rate, wherein the sampling rate is used in decimating the intermediate data signal having the intermediate data rate to the final data signal having the final data rate;
- a coefficient generator configurable to process the final data rate and the sampling rate to generate a plurality of coefficients, wherein the coefficient generator is configurable to calculate the plurality of coefficients responsive to change in the sampling rate, and wherein the plurality of coefficients is used in conditioning the initial data signal to generate a conditioned data signal conditioned for decimation to the final data rate, the conditioned data signal used in generating the intermediate signal having the intermediate data rate, and the intermediate data signal subsequently decimated to produce the final data signal having the final data rate; and
- an output component configurable to output the plurality of coefficients.

25. The logic device of claim 24, wherein the coefficient generator is configurable to receive the intermediate data rate.

26. The logic device of claim 24, wherein the coefficient generator comprises a look-up table or a filter compiler.

27. The logic device of claim 24, wherein the coefficient generator is coupled with a counter to receive the sampling rate.

28. The logic device of claim 24, where the plurality of coefficients is associated with a plurality of finite impulse response (FIR) filters.

29. A method for providing a plurality of coefficients to be used in generating an intermediate data signal having an intermediate data rate from an initial data signal having an initial data rate, the intermediate data signal subsequently decimated to produce a final data signal with a final data rate, the method comprising:
- receiving, with a digital device comprising a programmable logic device or other logic device, the final data rate and a sampling rate, wherein the sampling rate is used in decimating the intermediate data signal having the intermediate data rate to the final data signal having the final data rate; and, with the digital device:
- calculating a plurality of coefficients based on the final data rate and the sampling rate, said calculating performed responsive to a change in the sampling rate, wherein the calculated plurality of coefficients is used to condition the initial data signal to generate a conditioned data signal conditioned for decimation to the final data rate, the conditioned data signal used in generating the intermediate signal having the intermediate data rate, and the intermediate data signal subsequently decimated to produce the final data signal having the final data rate, wherein said calculating is performed using a coefficient generator; and
- outputting said plurality of coefficients.

30. The method of claim 29, further comprising receiving the intermediate data rate.

31. The method of claim 29, wherein said calculating comprises looking-up the plurality of coefficients based on the final data rate.

32. The method of claim 29, wherein said plurality of coefficients is associated with a plurality of finite impulse response (FIR) filters.

33. The method of claim 29, wherein said calculating comprises applying a filter compiler based on the final data rate.

34. A non-transitory computer-readable medium for providing a plurality of coefficients to be used in generating an intermediate data signal having an intermediate data rate from an initial data signal having an initial data rate, the intermediate data signal subsequently decimated to produce a final data signal with a final data rate, the non-transitory computer-readable medium including a set of instructions that causes a computer to perform a method comprising:
- receiving a final data rate and a sampling rate;
- calculating a plurality of coefficients based on the final data rate and the sampling rate, wherein said calculating is performed responsive to change in the sampling rate, and wherein the calculated plurality of coefficients used to condition the initial data signal to generate a conditioned data signal conditioned for decimation to the final data rate, the conditioned data signal used in generating the intermediate signal having the intermediate data rate, and the intermediate data signal subsequently decimated to produce the final data signal having the final data rate; and
- outputting said plurality of coefficients.

35. The non-transitory computer-readable medium of claim 34, wherein the method comprises receiving the intermediate data rate.

36. The non-transitory computer-readable medium claim 34, wherein calculating comprises looking-up the plurality of coefficients based on the final data rate.

37. The non-transitory computer-readable medium of claim 34, wherein calculating the plurality of coefficients comprises calculating the plurality of coefficients associated with a plurality of finite impulse response (FIR) filters.

38. The non-transitory computer-readable medium claim 34, wherein calculating comprises applying a filter compiler based on the final data rate.

* * * * *